(12) United States Patent
Ishino et al.

(10) Patent No.: US 12,028,042 B2
(45) Date of Patent: Jul. 2, 2024

(54) PIEZOELECTRIC RESONATOR DEVICE HAVING A THROUGH HOLE AND THROUGH ELECTRODE FOR CONDUCTION WITH AN EXTERNAL ELECTRODE TERMINAL

(71) Applicant: DAISHINKU CORPORATION, Kakogawa (JP)

(72) Inventors: Satoru Ishino, Kakogawa (JP); Hiroki Yoshioka, Kakogawa (JP); Hiroki Fujiwara, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 596 days.

(21) Appl. No.: 17/417,778

(22) PCT Filed: Dec. 19, 2019

(86) PCT No.: PCT/JP2019/049915
§ 371 (c)(1),
(2) Date: Jun. 24, 2021

(87) PCT Pub. No.: WO2020/137830
PCT Pub. Date: Jul. 2, 2020

(65) Prior Publication Data
US 2022/0077841 A1    Mar. 10, 2022

(30) Foreign Application Priority Data

Dec. 27, 2018   (JP) ................................. 2018-244559

(51) Int. Cl.
*H03H 9/10*    (2006.01)
*H03B 5/32*    (2006.01)
(Continued)

(52) U.S. Cl.
CPC ............. *H03H 9/1035* (2013.01); *H03B 5/32* (2013.01); *H03H 9/125* (2013.01); *H03H 9/19* (2013.01); *H03H 9/0523* (2013.01)

(58) Field of Classification Search
CPC ........ H03H 9/1035; H03H 9/125; H03H 9/19; H03H 9/0523; H03H 9/131; H03H 9/0547;
(Continued)

(56) References Cited

U.S. PATENT DOCUMENTS

| 6,507,139 | B1 | 1/2003 | Ishino et al. |
| 2003/0076010 | A1 | 4/2003 | Ishino et al. |

(Continued)

FOREIGN PATENT DOCUMENTS

| JP | H11-26628 A | 1/1999 |
| JP | 2004-214787 A | 7/2004 |

(Continued)

*Primary Examiner* — Emily P Pham
(74) *Attorney, Agent, or Firm* — METROLEX IP LAW GROUP, PLLC

(57) ABSTRACT

In a piezoelectric resonator device according to one or more embodiments, an internal space for hermetically sealing a vibrating part including a first excitation electrode and a second excitation electrode of a crystal resonator plate is formed by bonding a first sealing member and a second sealing member respectively to the crystal resonator plate. A through hole is formed in the second sealing member. A through electrode is formed along an inner wall surface of the through hole to establish conduction between an electrode formed on a first main surface and an external electrode terminal formed on a second main surface. A corrosion resistance structure to solder is formed on the through electrode that establishes conduction between the electrode and the external electrode terminal with a conductive metal other than Au.

8 Claims, 12 Drawing Sheets

(51) Int. Cl.
*H03H 9/125* (2006.01)
*H03H 9/19* (2006.01)
*H03H 9/05* (2006.01)

(58) Field of Classification Search
CPC ............ H03B 5/32; H01L 2224/16225; H01L 2924/15173; H01L 25/065; H01L 25/07; H01L 25/18
See application file for complete search history.

(56) References Cited

U.S. PATENT DOCUMENTS

| | | |
|---|---|---|
| 2010/0270891 A1 | 10/2010 | Kohda et al. |
| 2012/0313721 A1* | 12/2012 | Kohda ............... H03H 9/0547 29/25.35 |
| 2015/0155224 A1 | 6/2015 | Koyama |
| 2016/0329484 A1 | 11/2016 | Iizuka et al. |
| 2018/0034442 A1* | 2/2018 | Kojo ................... H03H 9/0547 |
| 2018/0191303 A1 | 7/2018 | Kojo |
| 2019/0312562 A1* | 10/2019 | Ishino ..................... H03H 9/19 |
| 2021/0035874 A1 | 2/2021 | Kudo et al. |

FOREIGN PATENT DOCUMENTS

| | | |
|---|---|---|
| JP | 2007-318350 A | 12/2007 |
| JP | 2010-252051 A | 11/2010 |
| JP | 2013-051510 A | 3/2013 |
| JP | 2013-162295 A | 8/2013 |
| JP | 2014-143600 A | 8/2014 |
| JP | 2015-106638 A | 6/2015 |
| JP | WO2015/102080 A1 | 3/2017 |
| JP | 2018-046476 A | 3/2018 |
| JP | 2018-074021 A | 5/2018 |
| JP | 6323768 B1 | 5/2018 |
| JP | 2018-139302 A | 9/2018 |
| JP | 2018-142888 A | 9/2018 |
| TW | 201535809 A | 9/2015 |
| TW | 201806096 A | 2/2018 |
| WO | 2010/016487 A1 | 2/2010 |
| WO | 2016/199645 A1 | 12/2016 |
| WO | 2018/051800 A1 | 3/2018 |

* cited by examiner

PIEZOELECTRIC RESONATOR DEVICE HAVING A THROUGH HOLE AND THROUGH ELECTRODE FOR CONDUCTION WITH AN EXTERNAL ELECTRODE TERMINAL

TECHNICAL FIELD

The present invention relates to a piezoelectric resonator device.

BACKGROUND ART

Recently, in various electronic devices, the operating frequencies have increased and the package sizes (especially, the heights) have decreased. According to such an increase in operating frequency and a reduction in package size, there is also a need for piezoelectric resonator devices (such as a crystal resonator and a crystal oscillator) to be adaptable to the increase in operating frequency and the reduction in package size.

In this kind of piezoelectric resonator devices, a housing is constituted of a package having a substantially rectangular parallelepiped shape. The package is constituted of: a first sealing member and a second sealing member both made of, for example, glass or crystal; and a piezoelectric resonator plate made of, for example, crystal. On respective main surfaces of the piezoelectric resonator plate, excitation electrodes are formed. The first sealing member and the second sealing member are laminated and bonded via the piezoelectric resonator plate. Thus, a vibrating part (excitation electrodes) of the piezoelectric resonator plate that is disposed in the package (in the internal space) is hermetically sealed (for example, see Patent Document 1). Hereinafter, such a laminated structure of the piezoelectric resonator device is referred to as a sandwich structure.

PRIOR ART DOCUMENT

Patent Document

[Patent Document 1] JP 2010-252051 A

SUMMARY OF THE INVENTION

Problem to be Solved by the Invention

In the piezoelectric resonator device as described above, normally, a through electrode formed on a through hole establishes conduction between electrodes and wiring. Furthermore, when the piezoelectric resonator device is mounted on an external circuit board (mounting board), solder is generally used, which means that the solder is interposed between an external electrode terminal of the second sealing member and the external circuit board.

However, the solder contains Sn (tin), and thus, when the through electrode of the through hole includes an Au film made of Au (gold), the solder may wet and spread inside the through electrode along the Au film. Therefore, due to corrosion by the solder, Au that constitutes the Au film agglomerates, which may generate problems such as increase of conduction resistance and disconnection.

The present invention was made in consideration of the above circumstances, an object of which is to provide a piezoelectric resonator device in which it is possible to prevent the solder from wetting and spreading inside the through electrode formed on the through hole.

Means for Solving the Problem

In order to solve the above problems, a piezoelectric resonator device of the present invention includes: a piezoelectric resonator plate including a first excitation electrode that is formed on a first main surface of a substrate, and a second excitation electrode that is formed on a second main surface of the substrate and that makes a pair with the first excitation electrode; a first sealing member covering the first excitation electrode of the piezoelectric resonator plate; a second sealing member covering the second excitation electrode of the piezoelectric resonator plate; and an internal space formed by bonding the first sealing member to the piezoelectric resonator plate and furthermore bonding the second sealing member to the piezoelectric resonator plate. The internal space hermetically seals a vibrating part including the first excitation electrode and the second excitation electrode of the piezoelectric resonator plate. A through hole is formed in the second sealing member, and a through electrode is formed along an inner wall surface of the through hole so as to establish conduction between an electrode formed on a first main surface of the second sealing member and an external electrode terminal formed on a second main surface of the second sealing member. The external electrode terminal is electrically connected to an external circuit board via solder. A corrosion resistance structure to the solder is formed on the through electrode. More specifically, the through electrode establishes conduction between the electrode on the first main surface and the external electrode terminal on the second main surface with a conductive metal other than Au.

With the above-described configuration, the through electrode of the through hole in the second sealing member establishes conduction between the electrode on the first main surface and the external electrode terminal of the second main surface of the second sealing member with the conductive metal other than Au. In this way, it is possible to cut off the corrosion path of the solder on the through electrode and thus to prevent the solder from wetting and spreading inside the through electrode, which can avoid increase of conduction resistance or disconnection.

In the above-described configuration, it is preferable that the through electrode is formed by removing part or whole of an Au film out of a metal film made of the conductive metal formed on the inner wall surface of the through hole and the Au film formed on an inner wall surface of the metal film.

With this configuration, the Au film is cut off on the through electrode of the through hole in the second sealing member, because the Au film may serve as the corrosion path of the solder. The metal film made of the conductive metal other than Au establishes conduction between the electrode on the first main surface and the external electrode terminal on the second main surface of the second sealing member. In this way, it is possible to cut off the corrosion path of the solder on the through electrode and thus to prevent the solder from wetting and spreading inside the through electrode, which can avoid increase of conduction resistance or disconnection.

In the above-described configuration, it is preferable that the Au film formed on part of the through electrode on the side of the external electrode terminal is at least removed. In this case, it is more preferable that the Au film formed from the end part of the through electrode on the side of the external electrode terminal to a center position of the through electrode in a depth direction is at least removed. In this way, since the solder for mounting the piezoelectric resonator device on an external circuit board is directly applied to the external electrode terminal, it is possible to effectively cut off the corrosion path of the solder by removing the part of the Au film on the through electrode of the through hole in the second sealing member, which is formed on the side of the external electrode terminal. As a result, it is possible to effectively prevent the solder from wetting and spreading inside the through electrode.

In the above-described configuration, it is preferable that the external electrode terminal has an outer metal film connected to the metal film of the through electrode and an outer Au film formed on the outer metal film, and that the outer Au film formed on a peripheral part of the through hole on the side of the external electrode terminal is removed. In this way, it is possible to cut off the corrosion path of the solder also on the part, which surrounds the through hole, of the external electrode terminal to which the solder is directly applied when mounting the piezoelectric resonator device on an external circuit board. As a result, it is possible to prevent the solder from wetting and spreading inside the through electrode.

In the above-described configuration, it is preferable that a through hole for the first sealing member is formed in the first sealing member, and that a seal path having an annular shape and hermetically sealing the internal space is each formed between the first sealing member and the piezoelectric resonator plate and between the piezoelectric resonator plate and the second sealing member. Also, it is preferable that the through hole for the first sealing member is filled with resin. In this case, it is preferable that the first sealing member is made of an AT-cut crystal resonator plate, and that the through hole for the first sealing member is formed so as to have an elongated hole shape extending in a Z' axis direction in plan view while the resin is formed so as to have, in plan view, a substantially elongated round shape extending in the Z' axis direction or a substantially elliptical shape in the Z' axis direction as a long axis direction.

With the above-described configuration, the resin can prevent water from entering the inside of the piezoelectric resonator device from the penetrating part of the through hole for the first sealing member. Accordingly, it is possible to reduce corrosion of the seal path caused by the water entering the inside of the piezoelectric resonator device, which contributes to reliable airtightness of the seal path.

In the above-described configuration, it is preferable that the resin is placed within the through hole for the first sealing member without protruding from a first main surface and a second main surface of the first sealing member. In this way, the thickness of the first sealing member including the resin can be easily adjusted, which leads to improvement of reliability in hermetic sealing by the seal path.

Effect of the Invention

In the piezoelectric resonator device of the present invention, the through electrode of the through hole in the second sealing member establishes conduction between the electrode on the first main surface and the external electrode terminal on the second main surface of the second sealing member 30 with the conductive metal other than Au. In this way, it is possible to cut off the corrosion path of the solder on the through electrode and thus to prevent the solder from wetting and spreading inside the through electrode, which can avoid increase of conduction resistance or disconnection.

MEANS FOR CARRYING OUT THE INVENTION

Hereinafter, an embodiment of the present invention will be described in detail with reference to the drawings. In the following embodiment, a piezoelectric resonator device to which the present invention is applied is a crystal oscillator.

Figure 1:
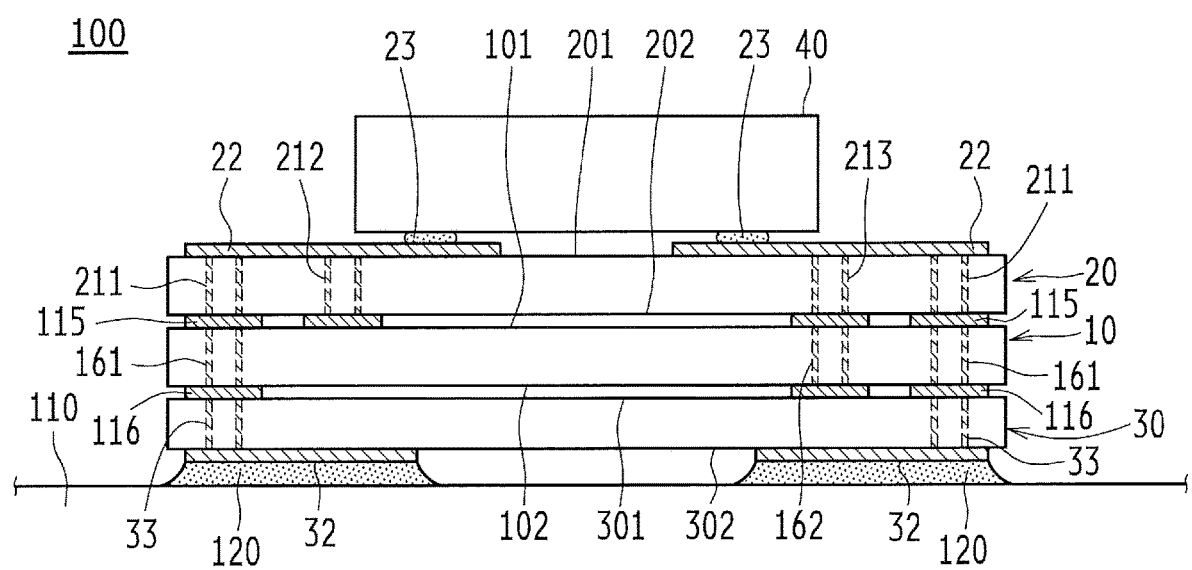
FIG. 1 is a schematic configuration diagram schematically illustrating a configuration of a crystal oscillator according to an embodiment.

First, the basic configuration of a crystal oscillator 100 according to this embodiment is described. As shown in FIG. 1, the crystal oscillator 100 includes: a crystal resonator plate (piezoelectric resonator plate) 10; a first sealing member 20; a second sealing member 30; and an IC chip 40. In this crystal oscillator 100, the crystal resonator plate 10 is bonded to the first sealing member 20, and furthermore the crystal resonator plate 10 is bonded to the second sealing member 30. Thus, a package having a sandwich structure is formed so as to have a substantially rectangular parallelepiped shape. In the crystal oscillator 100, the first sealing member 20 and the second sealing member 30 are bonded to respective main surfaces of the crystal resonator plate 10, thus an internal space (cavity) of the package is formed. In this internal space, a vibrating part 11 (see FIGS. 4 and 5) is hermetically sealed.

Also, the IC chip 40 is mounted on a main surface, which is opposite to a surface bonded to the crystal resonator plate 10, of the first sealing member 20. The IC chip 40 as an electronic component element is a one-chip integrated circuit element constituting, with the crystal resonator plate 10, an oscillation circuit.

The crystal oscillator 100 according to this embodiment has, for example, a package size of 1.0×0.8 mm, which is reduced in size and height. According to the size reduction, no castellation is formed in the package. Through holes (described later) are used for conduction between electrodes. The crystal oscillator 100 is electrically connected to an external circuit board (mounting board) 110 provided outside via solder 120.

Next, the respective components of the above-described crystal oscillator 100 (i.e. the crystal resonator plate 10, the first sealing member 20 and the second sealing member 30) are described with reference to FIGS. 1 to 7. Here, each of the components is described as a single body without being bonded. FIGS. 2 to 7 merely show respective configuration examples of the crystal resonator plate 10, the first sealing member 20 and the second sealing member 30, and thus the present invention is not limited thereto.

Figure 4:
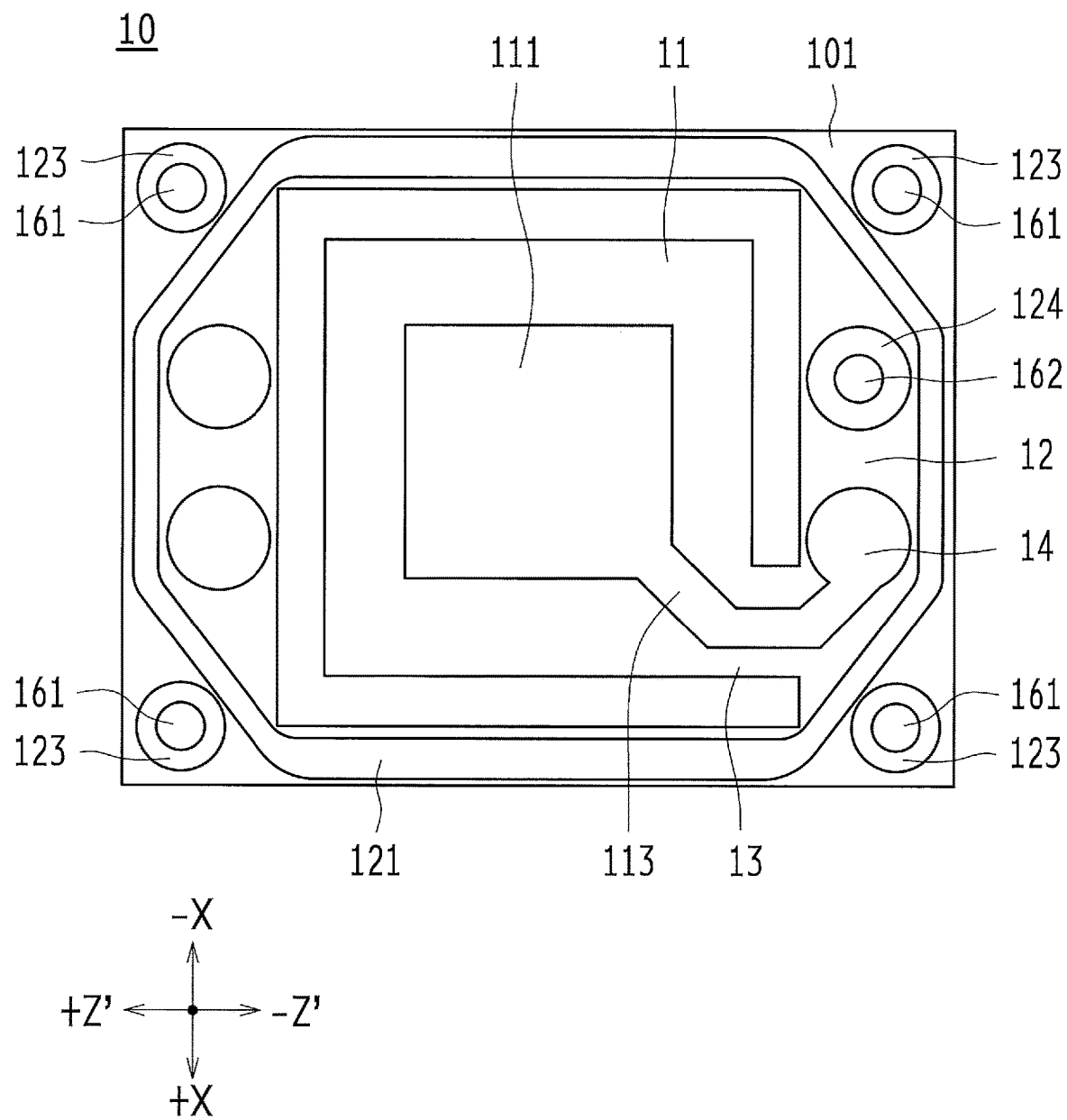
FIG. 4 is a schematic plan view illustrating a first main surface of a crystal resonator plate of the crystal oscillator.
Figure 5:
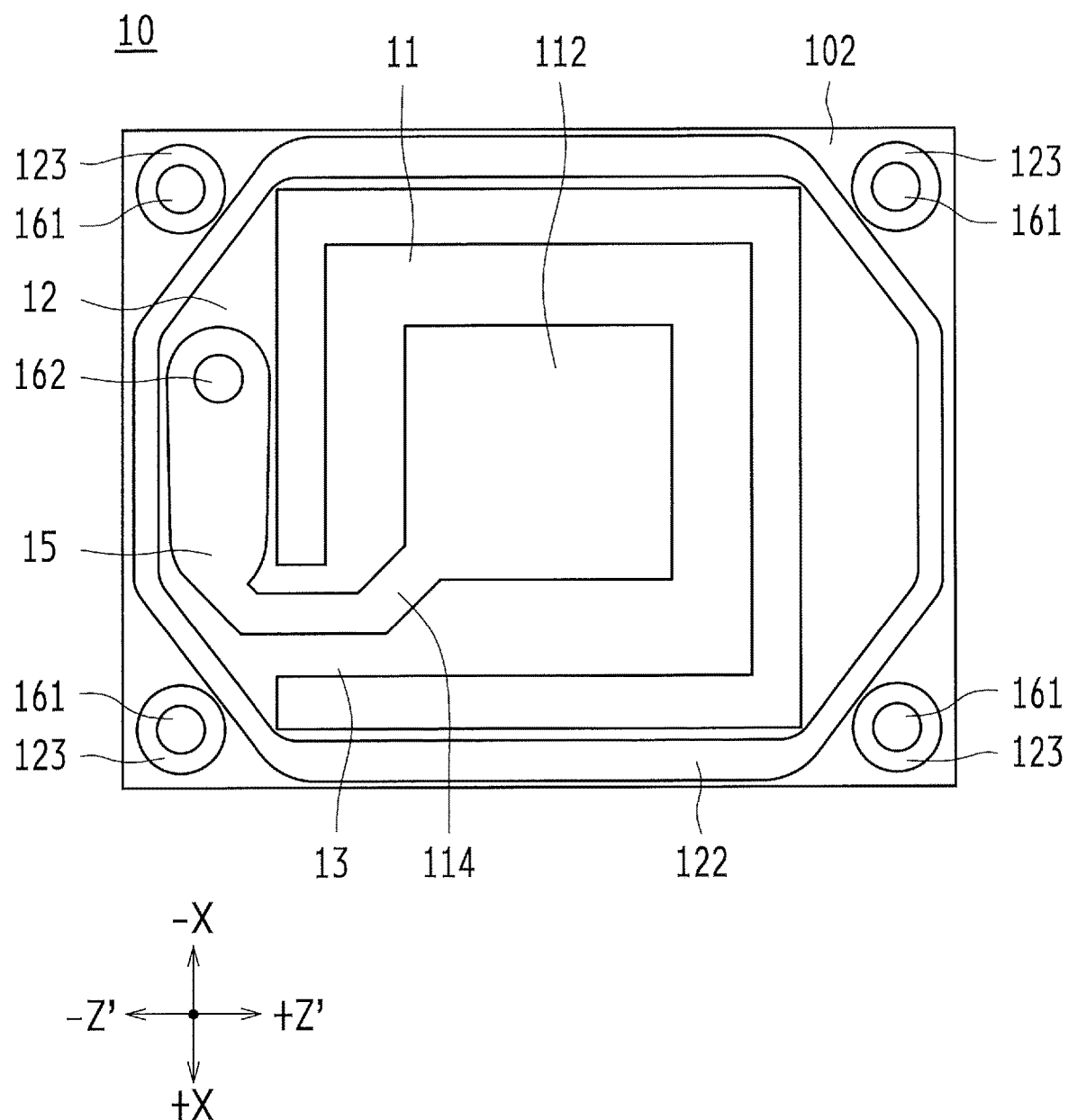
FIG. 5 is a schematic plan view illustrating a second main surface of the crystal resonator plate of the crystal oscillator.

The crystal resonator plate 10 is a piezoelectric substrate made of crystal as shown in FIGS. 4 and 5. Each main surface (i.e. a first main surface 101 and a second main surface 102) is formed as a smooth flat surface (mirror-finished). In this embodiment, an AT-cut crystal plate that causes thickness shear vibration is used as the crystal resonator plate 10. In the crystal resonator plate 10 shown in FIGS. 4 and 5, each main surface 101 and 102 of the crystal resonator plate 10 is an XZ' plane. On this XZ' plane, the direction parallel to the lateral direction (short side direction) of the crystal resonator plate 10 is the X axis direction, and the direction parallel to the longitudinal direction (long side direction) of the crystal resonator plate 10 is the Z' axis direction. The AT-cut method is a processing method in which a crystal plate is cut out of synthetic quartz crystal at an angle tilted by 35° 15' about the X axis from the Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by approximately 35° 15' from the Y axis and the Z axis out of the crystal axes of the crystal (this cutting angle may be changed to a certain extent within the range in which the frequency temperature characteristics of the AT-cut crystal resonator plate can be adjusted). The Y' axis direction and the Z' axis direction correspond to the directions in which the AT-cut crystal is cut out.

A pair of excitation electrodes (i.e. a first excitation electrode 111 and a second excitation electrode 112) is formed, respectively, on the main surfaces 101 and 102 of the crystal resonator plate 10. The crystal resonator plate 10 includes: the vibrating part 11 formed so as to have a substantially rectangular shape; an external frame part 12 surrounding the outer periphery of the vibrating part 11; and a support part 13 that supports the vibrating part 11 by connecting the vibrating part 11 to the external frame part 12. That is, the crystal resonator plate 10 has a configuration in which the vibrating part 11, the external frame part 12 and the support part 13 are integrally formed. The support part 13 extends (protrudes) from only one corner part positioned in the +X direction and in the −Z' direction of the vibrating part 11 to the external frame part 12 in the −Z' direction.

The first excitation electrode 111 is provided on the first main surface 101 side of the vibrating part 11 while the second excitation electrode 112 is provided on the second main surface 102 side of the vibrating part 11. The first excitation electrode 111 and the second excitation electrode 112 are respectively connected to pieces of lead-out wiring (first lead-out wiring 113 and second lead-out wiring 114) so that these excitation electrodes are connected to external electrode terminals. The first lead-out wiring 113 is drawn from the first excitation electrode 111 and connected to a connection bonding pattern 14 formed on the external frame part 12 via the support part 13. The second lead-out wiring 114 is drawn from the second excitation electrode 112 and connected to a connection bonding pattern 15 formed on the external frame part 12 via the support part 13.

Resonator-plate-side sealing parts to bond the crystal resonator plate 10 respectively to the first sealing member 20 and the second sealing member 30 are provided on the respective main surfaces (i.e. the first main surface 101 and the second main surface 102) of the crystal resonator plate 10. As the resonator-plate-side sealing part on the first main surface 101, a resonator-plate-side first bonding pattern 121 is formed. As the resonator-plate-side sealing part on the second main surface 102, a resonator-plate-side second bonding pattern 122 is formed. The resonator-plate-side first bonding pattern 121 and the resonator-plate-side second bonding pattern 122 are each formed on the external frame part 12 so as to have an annular shape in plan view.

Also, as shown in FIGS. 4 and 5, five through holes are formed in the crystal resonator plate 10 so as to penetrate between the first main surface 101 and the second main surface 102. More specifically, four first through holes 161 are respectively disposed in the four corners (corner parts) of the external frame part 12. A second through hole 162 is disposed in the external frame part 12, on one side in the Z' axis direction relative to the vibrating part 11 (in FIGS. 4 and 5, on the side of the −Z' direction). Connection bonding patterns 123 are formed on the respective peripheries of the first through holes 161. Also, on the periphery of the second through hole 162, a connection bonding pattern 124 is formed on the first main surface 101 side while the connection bonding pattern 15 is formed on the second main surface 102 side.

In the first through holes 161 and the second through hole 162, through electrodes are respectively formed along a corresponding inner wall surface of the above through holes so as to establish conduction between the electrodes formed on the first main surface 101 and the second main surface 102. Respective center parts of the first through holes 161 and the second through hole 162 are hollow penetrating parts penetrating between the first main surface 101 and the second main surface 102.

Figure 2:
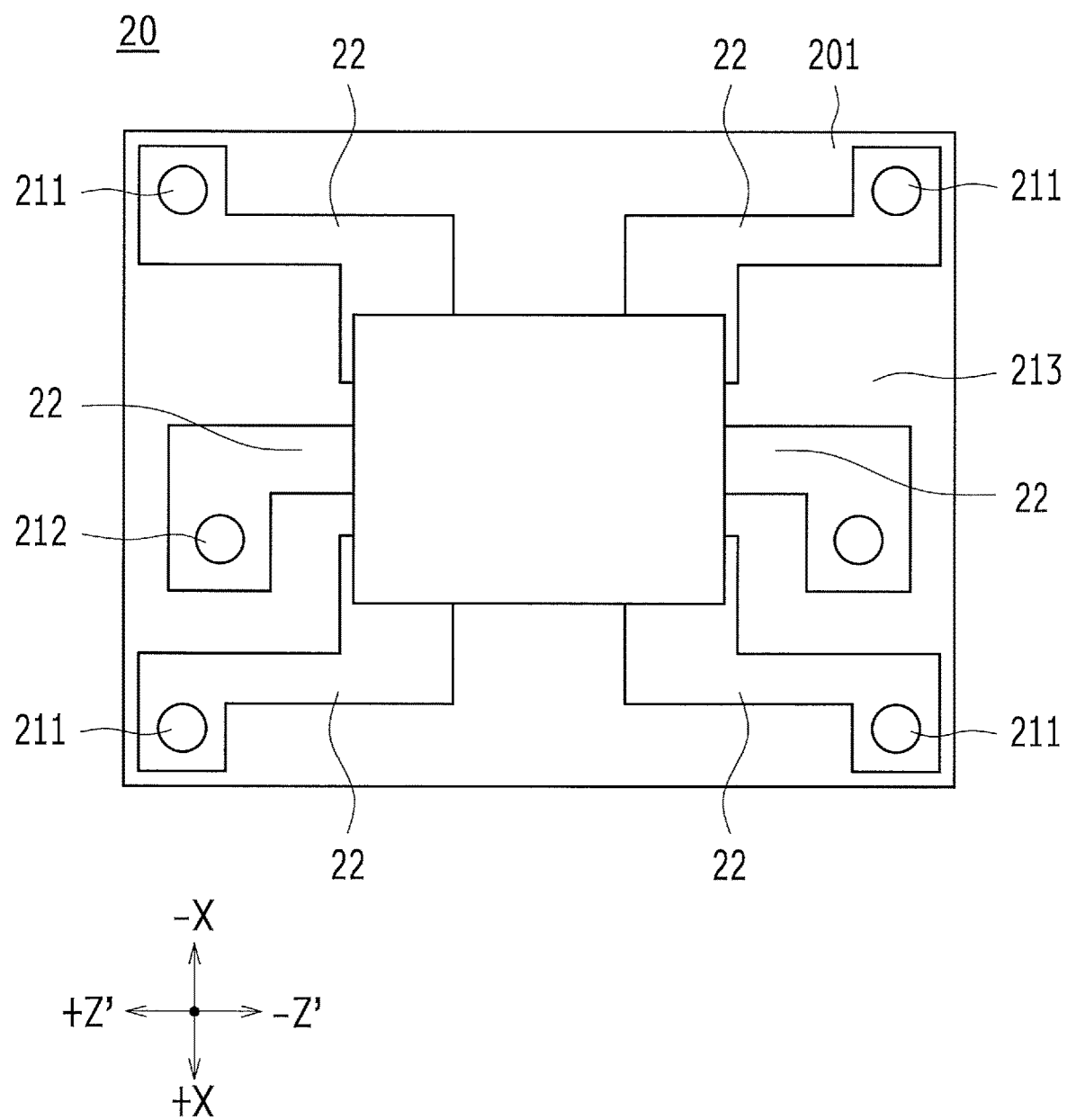
FIG. 2 is a schematic plan view illustrating a first main surface of a first sealing member of the crystal oscillator.
Figure 3:
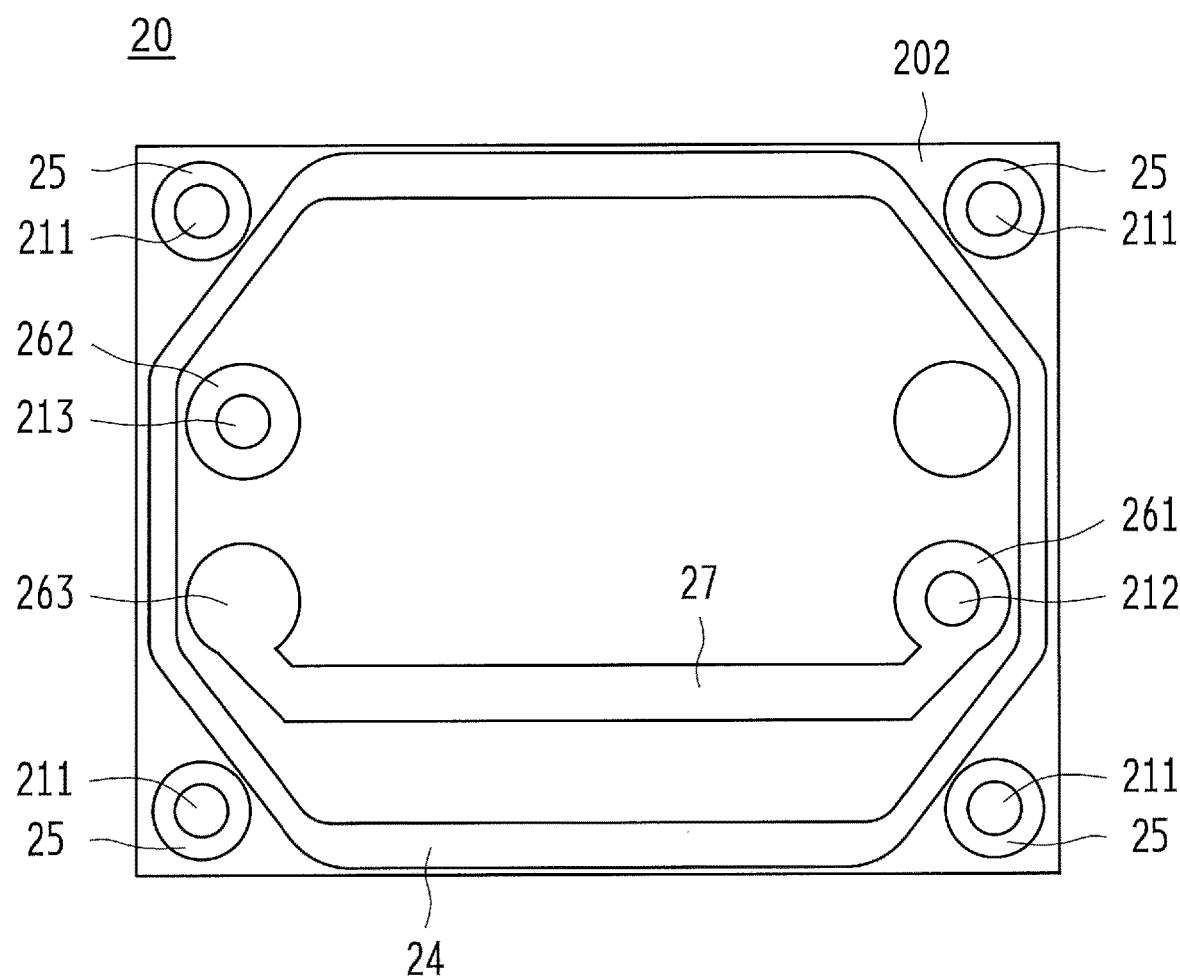
FIG. 3 is a schematic plan view illustrating a second main surface of the first sealing member of the crystal oscillator.
Figure 3:
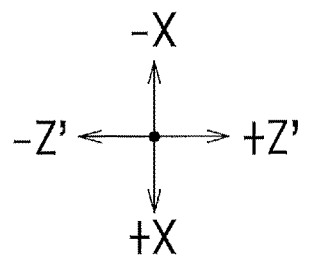

As shown in FIGS. 2 and 3, the first sealing member 20 is a substrate having a rectangular parallelepiped shape that is made of a single AT-cut crystal plate. A second main surface 202 (a surface to be bonded to the crystal resonator plate 10) of the first sealing member 20 is formed as a smooth flat surface (mirror finished). By making the first sealing member 20, which does not have the vibrating part, of the AT-cut crystal plate as in the case of the crystal resonator plate 10, it is possible for the first sealing member 20 to have the same coefficient of thermal expansion as the crystal resonator plate 10. Thus, it is possible to prevent thermal deformation of the crystal oscillator 100. Furthermore, the respective directions of the X axis, Y axis and Z' axis of the first sealing member 20 are the same as those of the crystal resonator plate 10.

As shown in FIG. 2, on a first main surface 201 (the surface on which the IC chip 40 is mounted) of the first sealing member 20, six electrode patterns 22 are formed, which include mounting pads for mounting the IC chip 40 as an oscillation circuit element. The IC chip 40 is bonded to the electrode patterns 22 by the flip chip bonding (FCB) method using a metal bump (for example, Au bump) 23 (see FIG. 1).

As shown in FIGS. 2 and 3, six through holes are formed in the first sealing member 20 so as to be respectively connected to the six electrode patterns 22 and also to penetrate between the first main surface 201 and the second main surface 202. More specifically, four third through holes 211 are respectively disposed in the four corners (corner parts) of the first sealing member 20. Fourth and fifth through holes 212 and 213 are disposed respectively in the +Z' direction and in the −Z' direction in FIGS. 2 and 3.

In the third through holes 211 and the fourth and fifth through holes 212 and 213, through electrodes are respectively formed along a corresponding inner wall surface of the above through holes so as to establish conduction between the electrodes formed on the first main surface 201 and the second main surface 202. Respective center parts of the third through holes 211 and the fourth and fifth through holes 212 and 213 are hollow penetrating parts penetrating between the first main surface 201 and the second main surface 202.

On the second main surface 202 of the first sealing member 20, a sealing-member-side first bonding pattern 24 is formed as a sealing-member-side first sealing part so as to be bonded to the crystal resonator plate 10. The sealing-member-side first bonding pattern 24 is formed so as to have an annular shape in plan view.

On the second main surface 202 of the first sealing member 20, connection bonding patterns 25 are respectively formed on the peripheries of the third through holes 211. A connection bonding pattern 261 is formed on the periphery of the fourth through hole 212, and a connection bonding pattern 262 is formed on the periphery of the fifth through hole 213. Furthermore, a connection bonding pattern 263 is formed on the side opposite to the connection bonding pattern 261 in the long axis direction of the first sealing member 20 (i.e. on the side of the −Z' direction). The connection bonding pattern 261 and the connection bonding pattern 263 are connected to each other via a wiring pattern 27.

Figure 6:
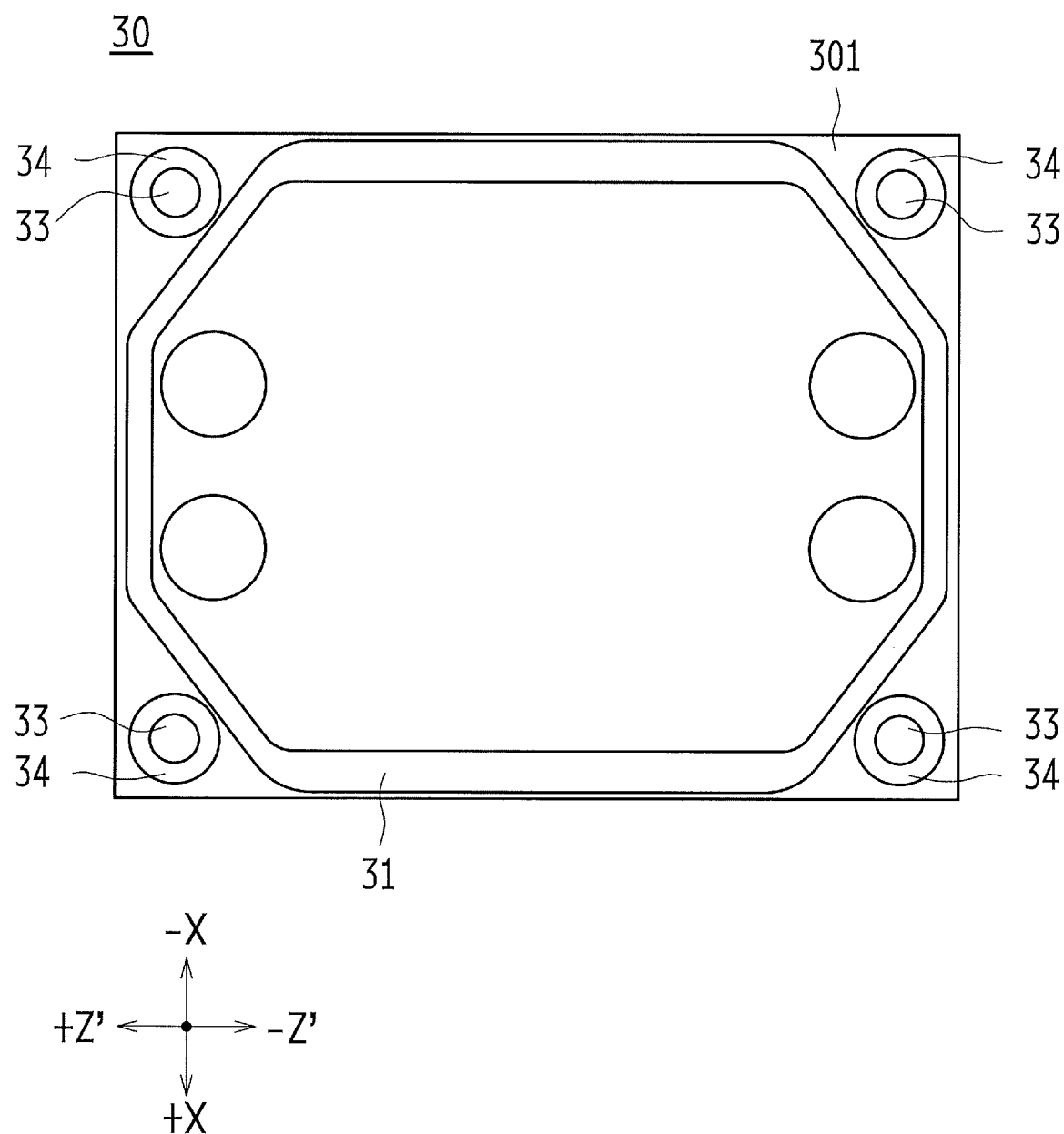
FIG. 6 is a schematic plan view illustrating a first main surface of a second sealing member of the crystal oscillator.
Figure 7:
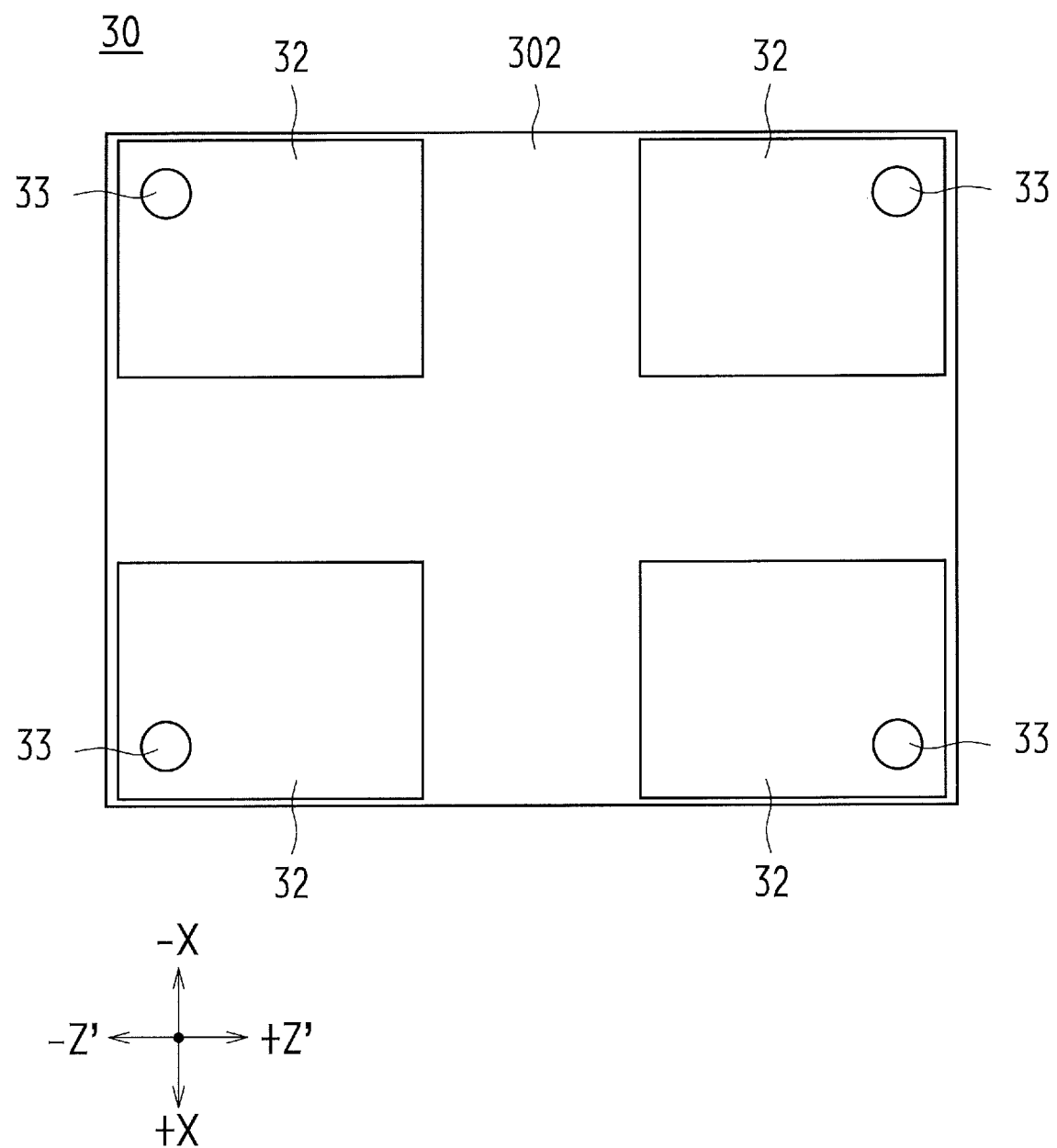
FIG. 7 is a schematic plan view illustrating a second main surface of the second sealing member of the crystal oscillator.

As shown in FIGS. 6 and 7, the second sealing member 30 is a substrate having a rectangular parallelepiped shape that is made of a single AT-cut crystal plate. A first main surface 301 (a surface to be bonded to the crystal resonator plate 10) of the second sealing member 30 is formed as a smooth flat surface (mirror finished). The second sealing member 30 is also preferably made of an AT-cut crystal plate as in the case of the crystal resonator plate 10, and the respective directions of the X axis, Y axis and Z' axis of the second sealing member 30 are preferably the same as those of the crystal resonator plate 10.

On the first main surface 301 of the second sealing member 30, a sealing-member-side second bonding pattern 31 is formed as a sealing-member-side second sealing part so as to be bonded to the crystal resonator plate 10. The sealing-member-side second bonding pattern 31 is formed so as to have an annular shape in plan view.

On a second main surface 302 (the outer main surface not facing the crystal resonator plate 10) of the second sealing member 30, four external electrode terminals 32 are formed, which are electrically connected, via the solder 120, to the external circuit board 110 provided outside the crystal oscillator 100. The external electrode terminals 32 are respectively located on the four corners (corner parts) on the second main surface 302 of the second sealing member 30.

As shown in FIGS. 6 and 7, four through holes are formed in the second sealing member 30 so as to penetrate between the first main surface 301 and the second main surface 302. More specifically, four sixth through holes 33 are respectively disposed in the four corners (corner parts) of the second sealing member 30. In the sixth through holes 33, through electrodes 331 (see FIG. 8) are respectively formed along a corresponding inner wall surface of the sixth through holes 33 so as to establish conduction between the electrodes formed on the first main surface 301 and the second main surface 302. In this way, the respective electrodes formed on the first main surface 301 are electrically conducted to the external electrode terminals 32 formed on the second main surface 302 via the through electrodes 331 formed along the inner wall surfaces of the sixth through holes 33. Also, respective central parts of the sixth through holes 33 are hollow penetrating parts 333 (see FIG. 8) penetrating between the first main surface 301 and the second main surface 302. On the first main surface 301 of the second sealing member 30, connection bonding patterns 34 are respectively formed on the peripheries of the sixth through holes 33.

In the crystal oscillator 100 including the crystal resonator plate 10, the first sealing member 20 and the second sealing member 30, the crystal resonator plate 10 and the first sealing member 20 are subjected to the diffusion bonding in a state in which the resonator-plate-side first bonding pattern 121 and the sealing-member-side first bonding pattern 24 are superimposed on each other, and the crystal resonator plate 10 and the second sealing member 30 are subjected to the diffusion bonding in a state in which the resonator-plate-side second bonding pattern 122 and the sealing-member-side second bonding pattern 31 are superimposed on each other, thus, the package having the sandwich structure as shown in FIG. 1 is produced. Accordingly, the internal space of the package, i.e. the space to house the vibrating part 11 is hermetically sealed.

In this case, the respective connection bonding patterns as described above are also subjected to the diffusion bonding in a state in which they are each superimposed on the corresponding connection bonding pattern. Such bonding between the connection bonding patterns allows electrical conduction of the first excitation electrode 111, the second excitation electrode 112, the IC chip 40 and the external electrode terminals 32 of the crystal oscillator 100.

More specifically, the first excitation electrode 111 is connected to the IC chip 40 via the first lead-out wiring 113, the wiring pattern 27, the fourth through hole 212 and the electrode pattern 22 in this order. The second excitation electrode 112 is connected to the IC chip 40 via the second lead-out wiring 114, the second through hole 162, the fifth through hole 213 and the electrode pattern 22 in this order. Also, the IC chip 40 is connected to the external electrode terminals 32 via the electrode patterns 22, the third through holes 211, the first through holes 161 and the sixth through holes 33 in this order.

In the crystal oscillator 100, the bonding patterns are each preferably made of a plurality of layers laminated on the crystal plate, specifically, a Ti (titanium) layer and an Au (gold) layer deposited by the vapor deposition in this order from the lowermost layer side. Also, the other pieces of wiring and electrodes formed on the crystal oscillator 100 each preferably have the same configuration as the bonding patterns, which leads to patterning of the bonding patterns, the pieces of wiring and the electrodes at the same time.

In the above-described crystal oscillator 100, sealing parts (seal paths) 115 and 116 that hermetically seal the vibrating part 11 of the crystal resonator plate 10 are formed so as to have an annular shape in plan view. The seal path 115 is formed by the diffusion bonding of the resonator-plate-side first bonding pattern 121 and the sealing-member-side first bonding pattern 24 as described above. The outer edge and the inner edge of the seal path 115 both have a substantially octagonal shape. In the same way, the seal path 116 is formed by the diffusion bonding of the resonator-plate-side second bonding pattern 122 and the sealing-member-side second bonding pattern 31 as described above. The outer edge and the inner edge of the seal path 116 both have a substantially octagonal shape.

In the crystal oscillator 100 having the seal paths 115 and 116 formed by the diffusion bonding as described above, the first sealing member 20 and the crystal resonator plate 10 have a gap of not more than 1.00 μm. The second sealing member 30 and the crystal resonator plate 10 have a gap of not more than 1.00 μm. That is, the thickness of the seal path 115 between the first sealing member 20 and the crystal resonator plate 10 is not more than 1.00 μm, and the thickness of the seal path 116 between the second sealing member 30 and the crystal resonator plate 10 is not more than 1.00 μm (specifically, the thickness in the Au—Au bonding in this embodiment is 0.15 to 1.00 μm). As a comparative example, the conventional metal paste sealing material containing Sn has a thickness of 5 to 20 μm.

Next, a description will be given on a corrosion resistance structure, to the solder 120, of the through electrodes 331 of the sixth through holes 33 formed in the four corners of the second sealing member 30 with reference to FIG. 8.

Figure 8:
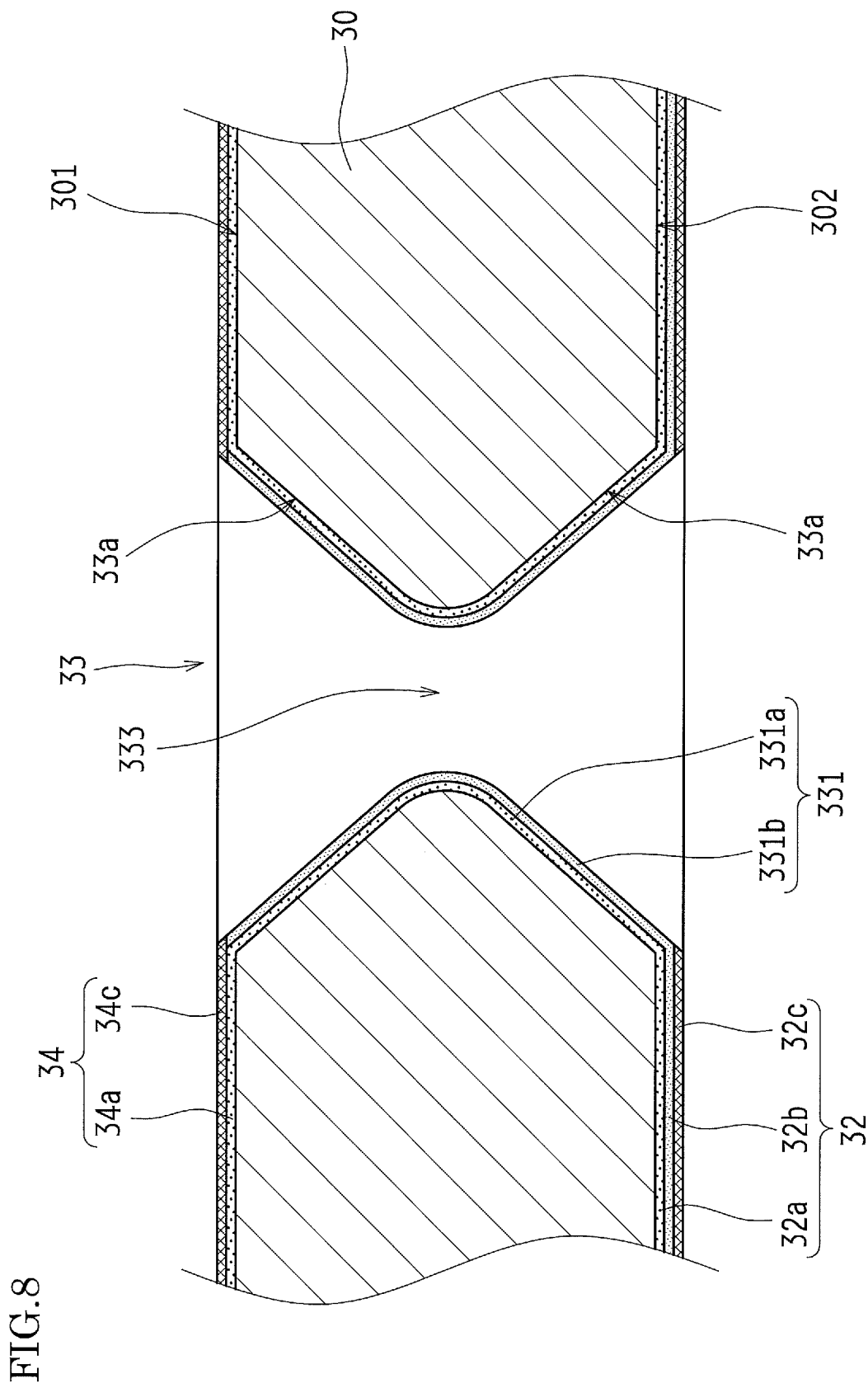
FIG. 8 is a schematic cross-sectional view illustrating a through hole in the second sealing member of the crystal oscillator.

As shown in FIG. 8, the sixth through hole 33 has the penetrating part 333 around the center in the in-plane direction, and also has an inclined surface 33a extending from the periphery of the sixth through hole 33 to the penetrating part 333 at the center part. The inclined surface 33a is formed on each of the main surfaces 301 and 302 of the second sealing member 30 by etching the sixth through hole 33 from the main surfaces 301 and 302 of the second sealing member 30 made of an AT-cut crystal plate.

The through electrode 331 is formed on the inner wall surface (inclined surface 33a) of the sixth through hole 33 formed in the second sealing member 30. In the second sealing member 30, the through electrodes 331 establish, respectively, conduction between the electrodes (connection bonding patterns) 34 formed on the first main surface 301 and the external electrode terminals 32 formed on the second main surface 302.

The electrodes 34 of the first main surface 301 each have a configuration constituted of a first metal film 34a made of a first conductive metal that is formed by, for example, vapor deposition on the first main surface 301, and an Au film 34c made of Au (gold) that is formed by, for example, vapor deposition on the first metal film 34a. The external electrode terminals 32 of the second main surface 302 each have a configuration constituted of a first metal film 32a made of the first conductive metal that is formed by, for example, vapor deposition on the second main surface 302, a second metal film 32b made of a second conductive metal that is formed by, for example, vapor deposition on the first metal film 32a, and an Au film 32c made of Au (gold) that is formed by, for example, vapor deposition on the second metal film 32b. The through electrodes 331 of the sixth through holes 33 each have a configuration constituted of a first metal film 331a made of the first conductive metal that is formed, for example, by vapor deposition on the inclined surface 33a of the sixth through hole 33, and a second metal film 331b made of the second conductive metal that is formed, for example, by vapor deposition on the first metal film 331a.

In this embodiment, Ti (titanium) is used as the first conductive metal, and Ni (nickel) is used as the second conductive metal. However, these first and second conductive metals are shown as one example, and other conductive metals may be used. The respective multilayer structures as described above of the through electrodes 331, the external electrode terminals 32 and the electrodes 34 are also shown each as one example. The number of the layers of the respective electrodes is not particularly limited. For example, the electrode 34 may have a three-layer structure including the second metal film similarly to the external electrode terminal 32. Alternatively, the external electrode terminal 32 may have a two-layer structure not including the second metal film similarly to the electrode 34.

The first metal film 34a of the electrode 34, the first metal film 331a of the through electrode 331 and the first metal film 32a of the external electrode terminal 32 are integrally formed. Also, the second metal film 331b of the through electrode 331 and the second metal film 32b of the external electrode terminal 32 are integrally formed.

On the other hand, the Au film 34c of the electrode 34 and the Au film 32c of the external electrode terminal 32 are not integrally formed. They are separated from each other by the inner part of the sixth through hole 33. The through electrode 331 establishes conduction between the electrode 34 and the external electrode terminal 32 with a conductive metal other than Au. Thus, in this case, it is possible to form the through electrode 331 by removing the Au film formed on the inclined surface 33a of the sixth through hole 33. More specifically, the Au film is also formed on the inclined surface 33a of the sixth through hole 33 integrally with the Au film 34c of the electrode 34 and the Au film 32c of the external electrode terminal 32. Then, the Au film on the inclined surface 33a of the sixth through hole 33 is removed by, for example, metal etching. Thus, the through electrode 331 not including the Au film is formed.

Figure 9:
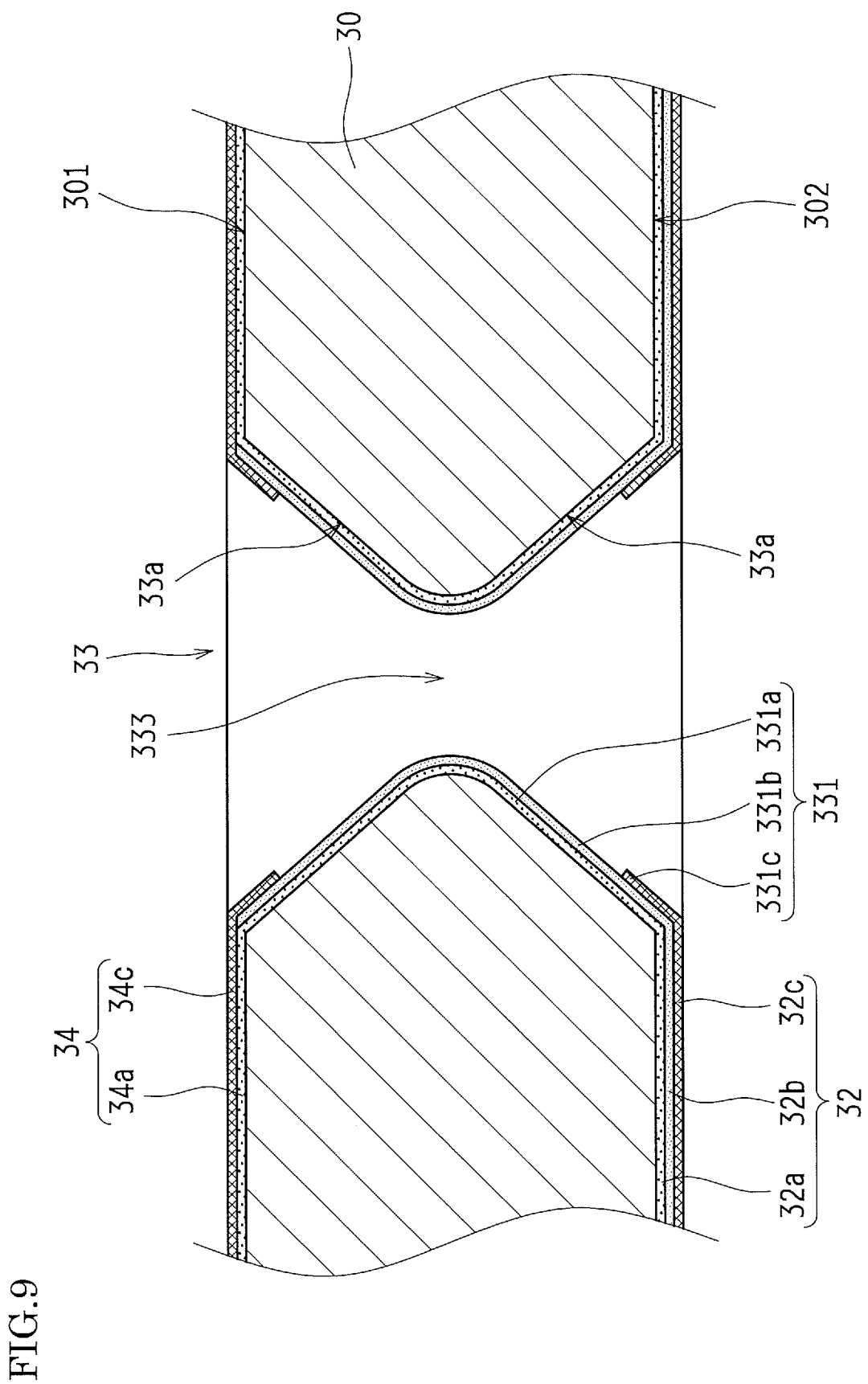
FIG. 9 is a schematic cross-sectional view corresponding to FIG. 8, which illustrates a crystal oscillator according to Variation 1.

The Au film on the inclined surface 33a of the sixth through hole 33 may be entirely removed as shown in FIG. 8. Alternatively, part of an Au film 331c on the inclined surface 33a of the sixth through hole 33 may be removed as shown in Variation 1 in FIG. 9. On the through electrode 331 shown in FIG. 9, the Au film 331c is partly formed on both end parts of the through electrode 331 in the vertical direction (Y' axis direction). However, the Au film 331c is not formed on the center part of the through electrode 331 in the vertical direction. In other words, the Au film 331c is cut off on the center part of the through electrode 331 in the vertical direction.

In this embodiment, part or whole of the Au film is removed from the through electrode 331 of the sixth through hole 33. The through electrode 331 establishes conduction with a conductive metal other than Au, which leads to higher corrosion resistance to the solder 120. Thus, it is possible to prevent the solder 120 from wetting and spreading inside the through electrode 331 formed on the sixth through hole 33. Hereinafter, a detailed description on this configuration will be given.

When the crystal oscillator 100 is mounted on the external circuit board 110, the solder 120 is generally used. The solder 120 is interposed between the external electrode terminal 32 of the second sealing member 30 and the external circuit board 110. However, the solder 120 contains Sn (tin), and thus, when the through electrode 331 includes the Au film, the solder 120 may wet and spread inside the through electrode 331 along the Au film. In this case, Au that constitutes the Au film agglomerates due to corrosion by the solder 120, which may generate problems such as increase of conduction resistance and disconnection. Thus, in the configuration in which the through electrode 331 establishes conduction with the Au film, the Au film may serve as a corrosion path of the solder 120.

Thus, in this embodiment, the Au film is cut off on the through electrode 331 of the sixth through hole 33 because the Au film may serve as the corrosion path of the solder 120. In the second sealing member 30, the first metal film 331a made of a conductive metal other than Au establishes conduction between the electrode 34 on the first main surface 301 and the external electrode terminal 32 on the second main surface 302. In this way, it is possible to cut off the corrosion path of the solder 120 on the through electrode 331 and thus to prevent the solder 120 from wetting and spreading inside the through electrode 331, which can avoid increase of conduction resistance or disconnection.

In this embodiment, it is preferable that all the through electrodes 331 of the sixth through holes 33 disposed in the four corners of the second sealing member 30 each have the above-described corrosion resistance structure to the solder 120. In addition to the through electrodes 331 of the sixth through holes 33 in the second sealing member 30, a similar corrosion resistance structure to the solder 120 may be provided on the through electrodes of the first through holes 161 of the crystal resonator plate 10 or on the through electrodes of the third through holes 211 of the first sealing member 20. Alternatively, in addition to the through electrodes 331 of the sixth through holes 33 in the second sealing member 30, the similar corrosion resistance structure to the solder 120 may be provided on the through electrodes of the first through holes 161 of the crystal resonator plate 10 and on the through electrodes of the third through holes 211 of the first sealing member 20.

The above-disclosed embodiment is to be considered in all respects as illustrative and not limiting. The technical scope of the invention is indicated by the appended claims rather than by the foregoing embodiment, and all modifications and changes that come within the meaning and range of equivalency of the claims are intended to be embraced therein.

In the above-described embodiment, the present invention is applied to the crystal oscillator 100. However, the present invention is not limited thereto. The present invention may be applied to a crystal resonator having a configuration in which the first sealing member 20, the crystal resonator plate 10 and the second sealing member 30 are laminated.

In the above-described embodiment, the number of the external electrode terminals 32 on the second main surface 302 of the second sealing member 30 is four. However, the present invention is not limited thereto. The number of the external electrode terminals 32 may be, for example, two, six, or eight.

In the above-described embodiment, part or whole of the Au film is removed from the through electrode 331 of the sixth through hole 33 in the second sealing member 30. However, the present invention is not limited thereto. In addition to the removal of part or whole of the Au film from the through electrode 331, it is possible to remove part of the Au film that surrounds the sixth through hole 33 (i.e. a peripheral part) on the external electrode terminal 32 of the second main surface 302. For example, in Variation 2 shown in FIG. 10, the Au film is removed from the lower part of the through electrode 331 (the part on the side of the external electrode terminal 32, e.g. in the −Y' direction) and also from the part surrounding the sixth through hole 33 of the external electrode terminal 32. In the case where part of the Au film is removed from the through electrode 331, it is preferable that the Au film is entirely removed from the part lower than the center position of the through electrode 331 in the vertical direction (Y' direction) (i.e. the part on the side of the external electrode terminal 32, e.g. in the −Y' direction).

Figure 10:
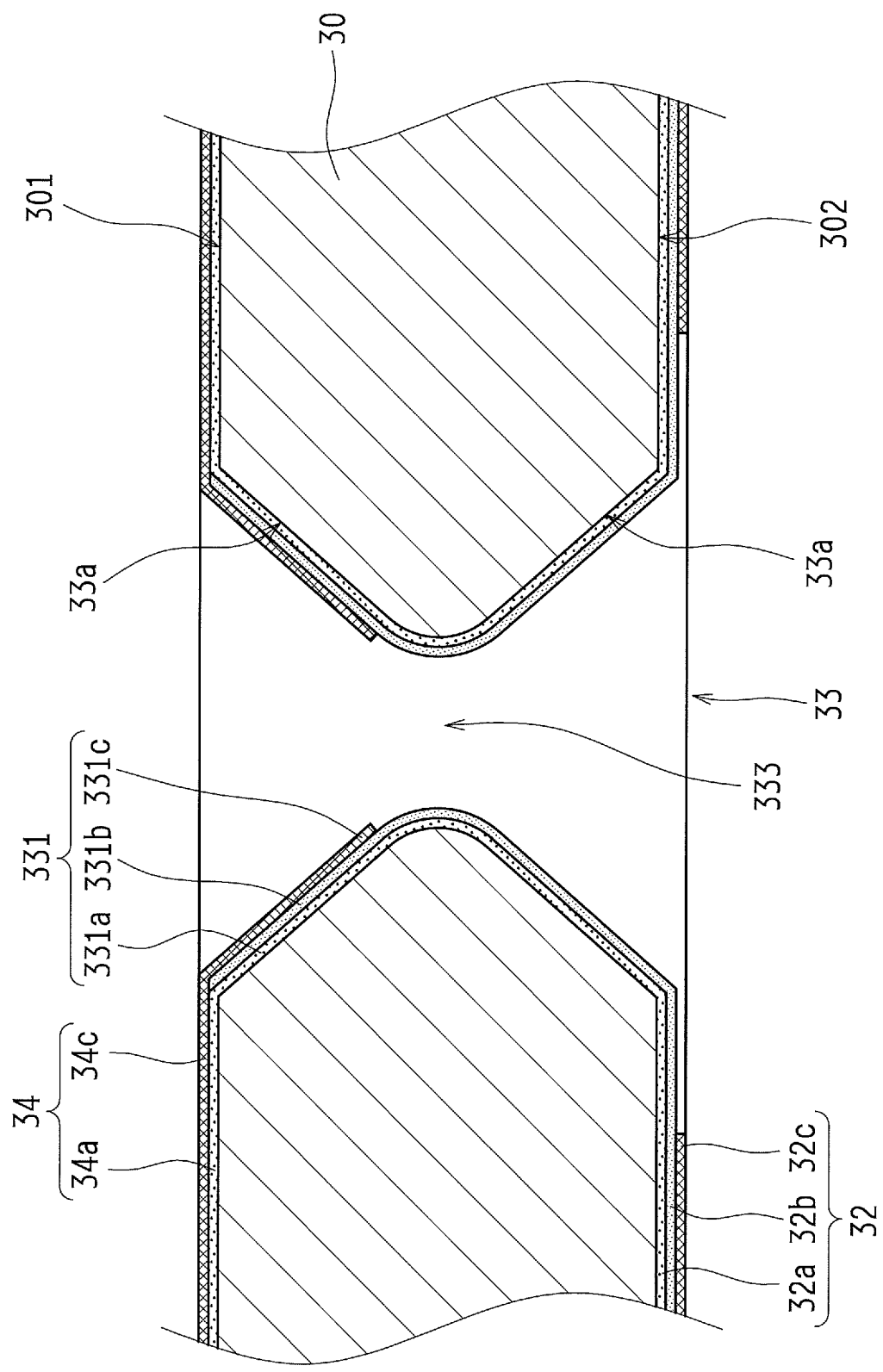
FIG. 10 is a schematic cross-sectional view corresponding to FIG. 8, which illustrates a crystal oscillator according to Variation 2.

From the viewpoint of further effectively blocking the corrosion path of the solder 120, it is preferable to remove, at least, the Au film formed on the lower side of the through electrode 331 of the sixth through hole 33 in the second sealing member 30, as shown in FIG. 10. That is, it is sufficient to remove the Au film at least from the end part of the through electrode 331 on the side of the external electrode terminal 32 to the center position of the through electrode 331 in the depth direction. In this case, the sixth through hole 33 has a substantially hourglass-shaped cross-section in which the center part in the depth direction is the narrowest and the opening area becomes gradually smaller from each opening end (i.e. on the first main surface 301 side and on the second main surface 302 side) to the center part in the depth direction. On the through electrode 331 formed on the sixth through hole 33 having the above-described cross-section, the Au film from the end part on the side of the external electrode terminal 32 to the part that exceeds the center position of the through electrode 331 in the depth direction is removed.

Since the solder 120 for mounting the crystal oscillator 100 on the external circuit board 110 is directly applied to the external electrode terminals 32, it is possible to effectively cut off the corrosion path of the solder 120 by removing the part of Au film of the through electrode 331 of the sixth through hole 33, which is formed on the external electrode terminal 32 side, as described above. As a result, it is possible to effectively prevent the solder 120 from wetting and spreading inside the through electrode 331. It is sufficient to remove the Au film completely from the end part on the external electrode terminal 32 side to the center position of the through electrode 331. Regarding the part that exceeds the center position of the through electrode 331, the amount (or the part) of Au film to be removed is not particularly limited.

Moreover, the Au film 32c is cut off on the part surrounding the sixth through hole 33 (i.e. the peripheral part) of the external electrode terminal 32. As shown in FIG. 10, the Au film 32c formed on the peripheral part of the sixth through hole 33 on the side of the external electrode terminal 32 is removed out of the Au film (outer Au film) 32c formed as the uppermost layer of the external electrode terminal 32. Thus, it is possible to cut off the corrosion path of the solder 120 also on the part, which surrounds the sixth through hole 33, of the external electrode terminal 32 to which the solder 120 is directly applied when mounting the crystal oscillator 100 on the external circuit board 110. As a result, it is possible to prevent the solder 120 from wetting and spreading inside the through electrode 331, which contributes to reduction of the problems such as increase of conduction resistance and disconnection.

In the above-described embodiment, part or whole of the Au film formed as the uppermost layer of the through electrode 331 of the sixth through hole 33 in the second sealing member 30 is removed. However, the present invention is not limited thereto. The present invention can also be applied to the configuration in which the Au film is formed as an inner film of the through electrode 331 of the sixth through hole 33 in the second sealing member 30. In this case, the inside formed Au film may be removed together with a metal film formed on the surface side, relative to the Au film, of the through electrode 331.

Figure 11:
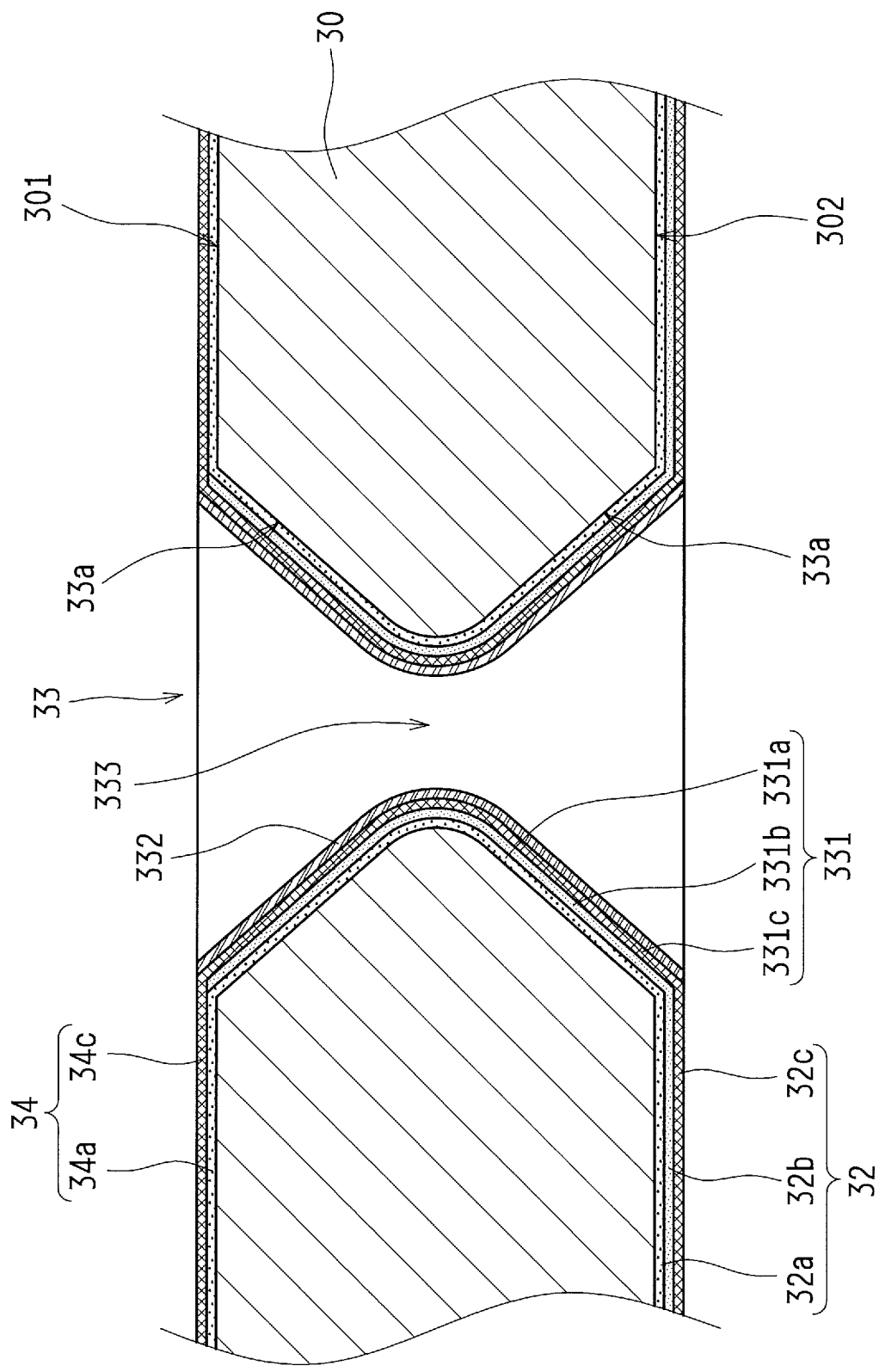
FIG. 11 is a schematic cross-sectional view corresponding to FIG. 8, which illustrates a crystal oscillator according to Variation 3.

Also in Variation 3 shown in FIG. 11, the Au film 331c of the through electrode 331 of the sixth through hole 33 in the second sealing member 30 is maintained, and furthermore a metal film 332 made of a metal other than Au (e.g. Ti) is formed on the Au film 331c. That is, the inner wall surface of the Au film 331c is covered by the metal film 332 made of a metal other than Au. In this case, it is possible to prevent the solder 120 from wetting and spreading along the Au film 331c formed as the uppermost layer of the through electrode 331 of the sixth through hole 33 in the second sealing member 30, which contributes to reduction of the problems such as increase of conduction resistance and disconnection. Note that it is still preferable to remove the Au film 331c laminated below the metal film 332 in the similar manner to the above-described embodiment from the viewpoint of further reliable prevention of wetting and spreading of the solder 120 inside the through electrode 331.

Figure 12:
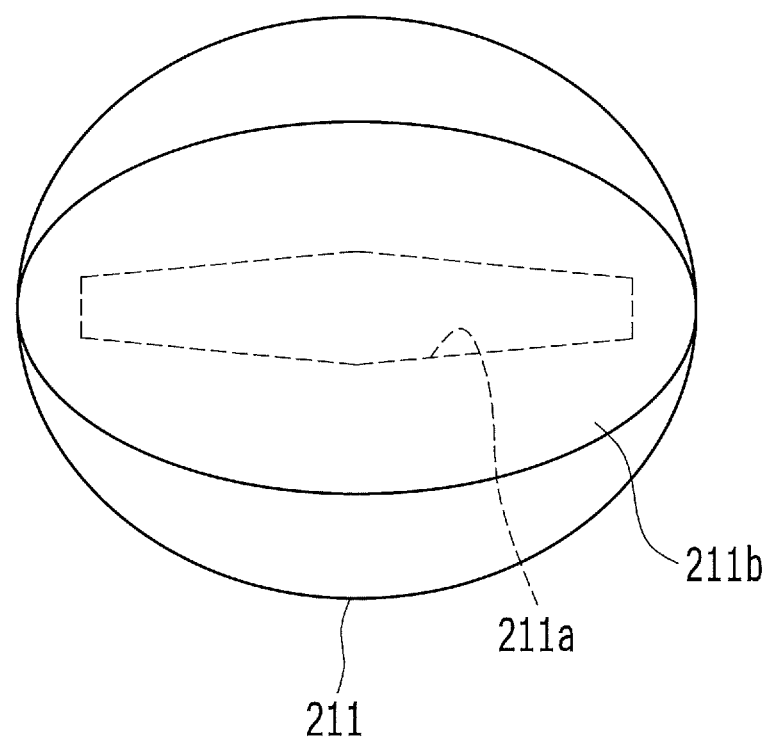
FIG. 12 is a schematic plan view illustrating a through hole in a first sealing member of a crystal oscillator according to Variation 4.
Figure 12:
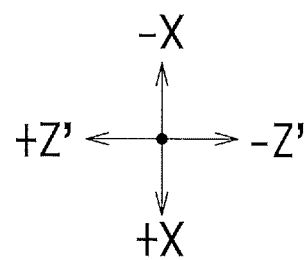

In the above-described embodiment, a penetrating part 211a of the third through hole 211 in the first sealing member 20 may be filled with resin 211b, as shown in Variation 4 in FIG. 12. In Variation 4 in FIG. 12, part of the third through hole 211 on the first main surface 201 side (+Y' axis direction side) in the first sealing member 20 is filled with the resin 211b. In this way, the resin 211b can prevent water from entering the inside of the crystal oscillator 100 from the penetrating part 211a of the third through hole 211. Accordingly, it is possible to reduce corrosion of the seal paths 115 and 116 (Ti corrosion) caused by the water entering the inside of the crystal oscillator 100, which contributes to reliable airtightness of the seal paths 115 and 116.

Here, in the third through hole 211 in the first sealing member 20, the penetrating part 211a is formed so as to have an elongated hole shape extending in the Z' axis direction in plan view as shown in FIG. 12. Therefore, when the resin 211b having a circle shape is used, the end part of the penetrating part 211a in the Z' axis direction of the third through hole 211 may not be filled with the resin 211b. Thus, in this variation, the resin 211b is formed so as to have, in plan view, a substantially elongated round shape extending in the Z' axis direction or a substantially elliptical shape in the Z' axis direction as the long axis direction. In this way, the end part of the penetrating part 211a in the Z' axis direction of the third through hole 211 is reliably filled with the resin 211b. Thus, by forming the shape of the resin 211b according to the penetrating part 211a of the third through hole 211, the resin 211b can further reliably prevent water from entering the inside of the crystal oscillator 100 from the penetrating part 211a of the third through hole 211. Accordingly, it is possible to reduce corrosion of the seal paths 115 and 116 (Ti corrosion) caused by the water entering the inside of the crystal oscillator 100, which contributes to further reliable airtightness of the seal paths 115 and 116. In addition to the part of the third through hole 211 on the first main surface 201 side (+Y' direction side) of the first sealing member 20, the resin 211b may be provided in the part of the third through hole 211 on the second main surface 202 side (−Y' direction side). Also, the sixth through holes 33 in the second sealing member 30 as well as the first through holes 161 in the crystal resonator plate 10 may be filled with the resin similarly to the above.

The resin 211b is placed within the third through hole 211 without protruding from the first main surface 201 and the second main surface 202 of the first sealing member 20. In other words, the upper surface of the resin 211b held in the third through hole 211 is positioned lower than the first main surface 201 of the first sealing member 20 (positioned on the −Y' direction side) while the lower surface of the resin 211b is positioned higher than the second main surface 202 of the first sealing member 20 (positioned on the +Y' direction side). In this way, whole of the resin 211b is placed within the third through hole 211. Thus, the thickness of the first sealing member 20 including the resin 211b can be easily adjusted, which leads to improvement of reliability in hermetic sealing by the seal paths 115 and 116.

In the above-described embodiment, the first sealing member 20 and the second sealing member 30 are each made of a crystal plate. However, the present invention is not limited thereto. The first sealing member 20 and the second sealing member 30 may be made of, for example, glass.

This application claims priority based on Patent Application No. 2018-244559 filed in Japan on Dec. 27, 2018. The entire contents thereof are hereby incorporated in this application by reference.

DESCRIPTION OF REFERENCE NUMERALS

10 Crystal resonator plate (piezoelectric resonator plate)
11 Vibrating part
20 First sealing member
30 Second sealing member
32 External electrode terminal
33 Sixth through hole (through hole)
100 Crystal oscillator (piezoelectric resonator device)
110 External circuit board
111 First excitation electrode
112 Second excitation electrode
120 Solder
301 First main surface (one main surface)
302 Second main surface (other main surface)
331 Through electrode

The invention claimed is:

1. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate; and
an internal space formed by bonding the first sealing member to the piezoelectric resonator plate and furthermore bonding the second sealing member to the piezoelectric resonator plate, the internal space hermetically sealing a vibrating part including the first excitation electrode and the second excitation electrode of the piezoelectric resonator plate, wherein
a through hole is formed in the second sealing member, and a through electrode is formed along an inner wall surface of the through hole so as to establish conduction between an electrode formed on a first main surface of the second sealing member and an external electrode terminal formed on a second main surface of the second sealing member, the through electrode establishes conduction between the electrode on the first main surface and the external electrode terminal on the second main surface with a conductive metal other than Au, the external electrode terminal is electrically connected to an external circuit board via solder, and
a corrosion resistance structure to the solder is formed on the through electrode.

2. The piezoelectric resonator device according to claim 1, wherein
the through electrode is formed by removing part or whole of an Au film out of a metal film made of the conductive metal formed on the inner wall surface of the through hole and the Au film formed on an inner wall surface of the metal film.

3. The piezoelectric resonator device according to claim 2, wherein
the Au film formed on part of the through electrode on a side of the external electrode terminal is at least removed.

4. The piezoelectric resonator device according to claim 3, wherein
the Au film is at least removed from an end part of the through electrode on the side of the external electrode terminal to a center position of the through electrode in a depth direction.

5. The piezoelectric resonator device according to claim 3, wherein
the external electrode terminal has an outer metal film connected to the metal film of the through electrode and an outer Au film formed on the outer metal film, and
the outer Au film formed on a peripheral part of the through hole on the side of the external electrode terminal is removed.

6. The piezoelectric resonator device according to claim 1, wherein
a through hole for the first sealing member is formed in the first sealing member,
a seal path having an annular shape and hermetically sealing the internal space is each formed between the first sealing member and the piezoelectric resonator plate and between the piezoelectric resonator plate and the second sealing member, and
the through hole for the first sealing member is filled with resin.

7. The piezoelectric resonator device according to claim 6, wherein
the first sealing member is made of an AT-cut crystal resonator plate,
the through hole for the first sealing member is formed so as to have an elongated hole shape extending in a Z" axis direction in plan view, and
the resin is formed so as to have, in plan view, a substantially elongated round shape extending in the Z" axis direction or a substantially elliptical shape in the Z" axis direction as a long axis direction.

8. The piezoelectric resonator device according to claim 6, wherein
the resin is placed within the through hole for the first sealing member without protruding from a first main surface and a second main surface of the first sealing member.

* * * * *